United States Patent [19]
Felps et al.

[11] Patent Number: 5,939,875
[45] Date of Patent: Aug. 17, 1999

[54] UNIVERSAL PROBE INTERFACE

[75] Inventors: Jimmie D Felps; Brian L. Richardson, both of Colorado Springs, Colo.

[73] Assignee: Hewlett-Packard Company, Palo Alto, Calif.

[21] Appl. No.: 08/818,855

[22] Filed: Mar. 17, 1997

[51] Int. Cl.[6] .................................................... G08B 1/08
[52] U.S. Cl. ........................ 324/115; 324/601; 324/72.5; 324/73.1
[58] Field of Search ................................ 324/72.5, 73.1, 324/115, 601; 340/537

[56] References Cited

U.S. PATENT DOCUMENTS

| | | | |
|---|---|---|---|
| 4,401,949 | 8/1983 | Gold | 324/73.1 |
| 4,423,373 | 12/1983 | LeCroy . | |
| 4,672,306 | 6/1987 | Thong | 324/72.5 |
| 4,708,661 | 11/1987 | Morland et al. . | |
| 5,015,947 | 5/1991 | Chism . | |
| 5,162,725 | 11/1992 | Hodson et al. . | |
| 5,293,122 | 3/1994 | Cake et al. . | |
| 5,489,888 | 2/1996 | Jagiella | 324/611 |
| 5,651,635 | 7/1997 | Pot | 324/115 |

FOREIGN PATENT DOCUMENTS

Wo 96 30848  10/1996  WIPO .

OTHER PUBLICATIONS

Franchi, S., et al., "Multimedia Perspectives for next Generation PAC Systems", Proceedings of the Annual Symposium on Computer Based Medical Systems, Durham Jun. 14–17, 1992, Symp. 5, Jun. 14, 1992, IEEE, pp. 156–159.
Wenzel, A. et al., A telecommunication system for the dental practitioner . . . , Medinfo 89. Proceedings of the Sixth conference on Medical Informatics, North Holland, Netherlands, 1989.
Herbig, F.K., et al., "Diagnostic services and Communication protocols for remote nuclear medicine laboratories", Proceedings of the fourth annual symposium on computer applications in medical care, IEEE USA 1980.
Herron, J.M., et al., "A multi–location teleradiology system for emergency triage consultation", vol. 2711, Proceedings of SPIE, SPIE, USA, 1996.
$I^2C$ Bus specification Dec. 1, 1988.

*Primary Examiner*—Josie Ballato
*Assistant Examiner*—Jose M. Solis

[57] ABSTRACT

An interface having nine connections between a probe and test and measurement equipment includes a fixed voltage source located in the test and measurement equipment, which delivers through a first connection a positive fixed voltage, and through a second connection a negative fixed voltage. A voltage-programming resistor located in the probe produces a signal that is delivered from the probe through one of the connections to the equipment to control a programmed voltage source. The programmed voltage is delivered as a positive programmed voltage through one pin and as a negative programmed voltage through a second connection. A probe identification resistor is located in the probe. An ohmmeter in the equipment measures the resistance of the probe identification resistor through one of the connections. This identity is delivered into the equipment so that the equipment, by accessing an internal look-up table, can obtain the probe's characteristics to configure the equipment for the circuit requirements of the probe. A two-way communication path between the probe and the test and measurement equipment is provided through two of the connections. An offset current is provided in the equipment and is delivered through one connection to the probe.

17 Claims, 6 Drawing Sheets

To Fig. 2b

UNIVERSAL PROBE INTERFACE

BACKGROUND OF THE INVENTION

1. Field of the Invention

The present invention relates to a universal interface between a number of different probes and various pieces of test and measurement equipment and, in particular, to a universal interface for an active or passive probe connecting to an oscilloscope or spectrum analyzer.

2. Statement of the Problem

The interface between a probe and a piece of test and measurement equipment such as an oscilloscope or spectrum analyzer must utilize a minimum number of connections and yet must enable a large number of different circuit functions along with the conventional RF BNC signal connector. This is especially true when a large number of different active or passive probes interface with the same test and measurement equipment. Probes have different operational characteristics such as attenuations, offset gains, input impedance requirements, and features such as AC coupling and DC reject. Probes have different control and power requirements. The probe generally has a probe pod for connecting to the test and measurement equipment. The probe pod may contain power supplies and circuitry as well as a connector. A need exists to provide a universal probe interface for a large number of different active and passive probes and a piece of test and measurement equipment.

Conventional probe interfaces provide an attachment to the test and measurement equipment that is sometimes difficult for the user to connect. Some prior probes have multiple cables for connections—for example, separate cables for RF and for power. The separate cables sometimes connect at different interface locations on the equipment or to other pieces of equipment such as an external power or control box. A need exists to eliminate the use of separate cables and to provide an interface connection with a minimum number of connections, but with a maximum interface intensity including the conventional BNC connection at a single location on the test and measurement equipment.

Such conventional probe interfaces only provide fixed voltage supplies from the test and measurement equipment to the probe and/or provide voltage sources or regulators within the probe that add weight, occupy large volumes of space, and add heat to the probe pod. A need exists to eliminate the use of voltage sources and regulators in the probe pod so as to minimize the weight, the space, and the heat in the probe pod so as to provide a minimum size for probe pods having minimum circuitry and power.

Conventional probes connected to test and measurement equipment such as oscilloscopes or spectrum analyzers do not automatically and completely set up the test and measurement equipment with respect to input impedance, attenuation, offset range, scale (i.e., units of measure displayed), and other probe features (e.g., DC reject, AC coupling, etc.). For a probe using a resistor I.D., even when automatically identified, the operator must also perform other tasks to completely set-up the probe such as manually setting the input impedance (e.g., 50 ohms input impedance for a 10:1 active probe). The operator must be assured that the probe is properly identified and the test and measurement equipment correctly and completely configured. Such conventional probes and their interface connections are difficult to use especially if manual configuration is required. A need exists to be capable of identifying a large number of probes (including future probes) upon installation to provide automatic and complete set-up of features for the identification of probes without operator intervention.

Many probes require the delivery of offset current through the interface. A need exists to calibrate zero offset current at the interface connection so that probes can be used without calibration.

With many probes available for use by an operator, it is imperative to know when a probe has been disconnected and when a new one has been connected. Hence, a need exists to immediately sense when a probe has been disconnected from the test and measurement equipment and when a new probe has been reconnected.

Some conventional probes have a male BNC connector with a pogo pin for interfacing with a female BNC connector and a probe identity ring around the female BNC connector. A need exists to provide a universal interface connection to the ring so that the universal interface operates to identify such conventional probes.

Some conventional probes have specific power supply voltage requirements. A need exists to provide a range of power supply voltages in a universal interface with a minimum of interface connections.

3. Solution to the Problem

The present invention provides a solution to the above needs as set forth next in the Summary of the Invention.

SUMMARY OF THE INVENTION

The present invention provides a universal interface between a number of active and passive probes and test and measurement equipment such as, but not limited to, an oscilloscope or a spectrum analyzer. The interface of the present invention includes an interface having a minimum number of connections including a standard BNC connection between the probe and a single location on the test and measurement equipment.

The interface of the present invention includes a pair of complimentary fixed voltage sources located in the test and measurement equipment. The fixed voltage sources are delivered through a first connection of the interface as a positive fixed voltage and through a second connection of the interface as a negative fixed voltage. In the preferred embodiment, the fixed voltages are +/−12 volts.

A voltage-programming resistor is located in the probe pod and produces a signal that is delivered from the probe pod through one of the interface connections to the test and measurement equipment. The delivered signal controls a pair of complimentary programmed voltage sources, which delivers a programmed voltage through two of the connections to the probe pod. The programmed voltages are delivered as a positive programmed voltage through one connection and as negative programmed voltage through a second connection. In the preferred embodiment, the programmed voltages are in the range of +/−(3 to 6) volts. This eliminates the need for having voltage sources or voltage regulators located in the probe pod, which occupy space, provide weight, and generate heat. This also allows probes to operate at different voltages.

A probe identification resistor is located in the probe pod. When a new probe is connected, an interrupt signal is generated in the equipment and an ohmmeter in the test and measurement equipment measures the resistance of the probe identification resistor through one of the interface connections. This identity is delivered into the test and measurement equipment. The test and measurement equipment looks up the identity of the probe in a look-up table and automatically and completely configures the test and measurement equipment for the circuit requirements of the probe without operator intervention. When the probe is disconnected from the test and measurement equipment, the ohmmeter issues an interrupt signal since the ohmmeter detects an open circuit at the interface connection with the probe identification resistor. The interrupt signal informs the operator that a probe is disconnected and also configures for a no-probe condition.

A two-way communication path between the probe pod and the test and measurement equipment is provided through two of the interface connections. These two lines can be used for the digital serial interface, as control lines to the probe pod to control AC coupling or DC reject, or as interrupt lines from the probe to run/stop acquisitions.

An offset current generator is provided in the test and measurement equipment and is delivered through one interface connection to the probe pod. The offset current generator is calibrated to produce zero current when it is programmed to produce zero current. Calibration of offset current minimizes offset voltage errors when a probe is connected.

In the preferred embodiment, a total of nine interface connections are formed centered in a line beneath a standard BNC connector which includes RF connection and enables the test and measurement equipment to work with a variety of different active and passive probes including future probes with requirements not known at this time.

DESCRIPTION OF THE PREFERRED EMBODIMENT

1. Overview of Probe-Equipment Interface

Figure 1:
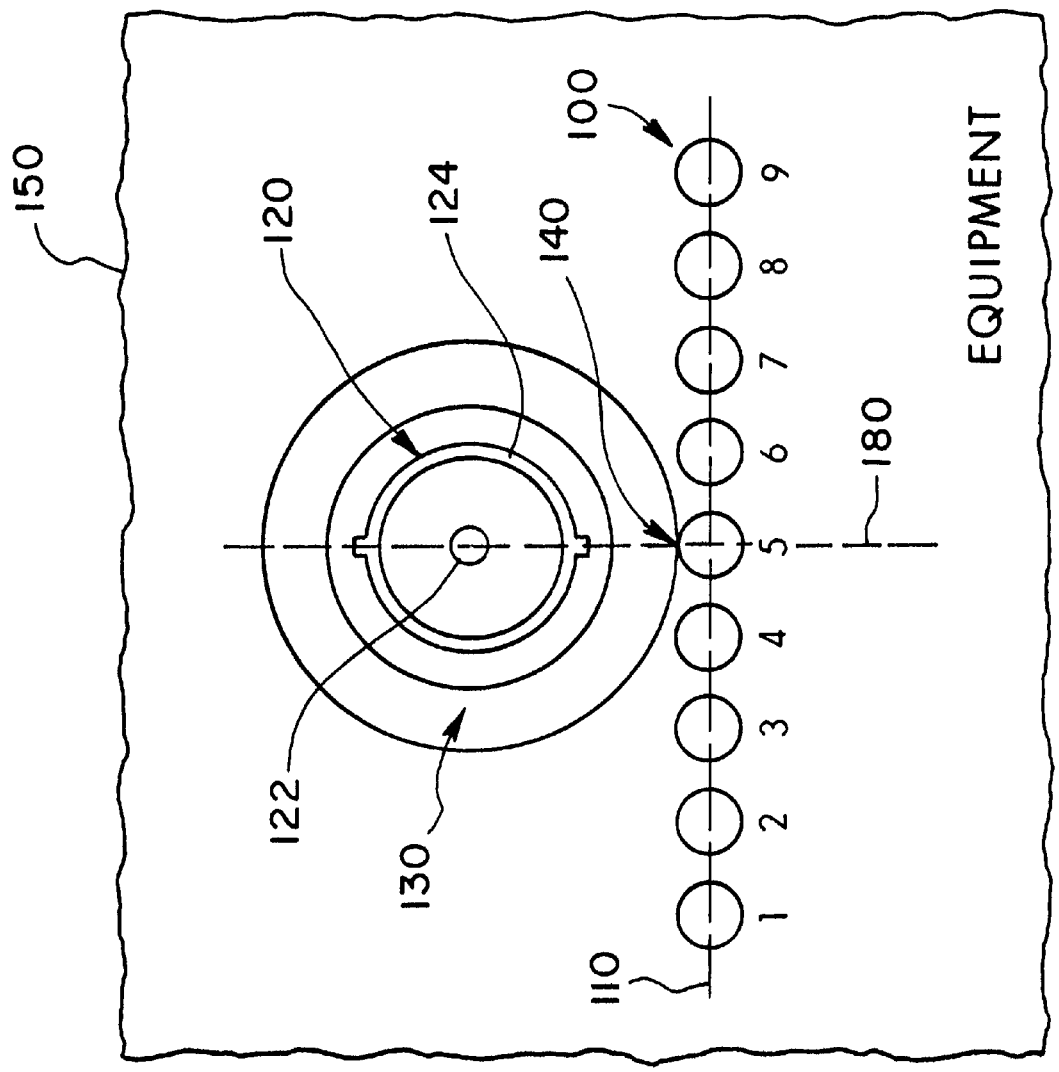
FIG. 1 sets forth an illustration showing the conventional female BNC connector on the face of the test and measurement equipment with the interface connections centered and formed in a line beneath the BNC connector.

In FIGS. 1 and 2, the interface 100 of the present invention is shown to have nine interface connections labeled 1–9 along with a conventional BNC 120 connection.

FIG. 1 sets forth the mechanical configuration of the nine pads 100 arranged centered in a line 110 below a conventional female BNC connector 120 on a piece of test and measurement equipment 150. The female BNC connector 120 has RF signal path 122 and RF ground 124. The ring 130 around the female BNC connector 120 is connected at point 140 to pad 5 as shown in FIG. 1. The ring 130 is also conventional and supports existing probes that have a pogo pin that rotates on the ring 130 when the BNC is connected. Pad 5 places the same probe ID connection (as will be explained later) in line with the other pads (i.e., 1–4 and 6–9) to facilitate connection.

With reference to FIGS. 1 and 2, the mechanical configuration shown provides a positive engagement for the interface 100 of the present invention. The probe pod has a mating male BNC connector 120' and a pin 5', which engages female BNC 120 and pad 5, respectively, along line 180. This aligns pins 1'–9' of the probe pod 160 with pads 1–9 along line 110. The perpendicular relationship of line 180 to line 110 provides a quick and positive engagement for the pod 160 to the test and measurement equipment 150. The line 110 below the female BNC 120 allows a flex circuit in the equipment 150 to easily connect to pads 1–9.

In FIG. 2, the electrical configuration for the nine interface connections 100 is shown. The nine pads 1–9 connect with nine corresponding pins 1'–9' on the probe pod 160, as shown. The nine interface connections 100 are identified in Table I below.

TABLE I

| Connection # | Signal name | Description |
| --- | --- | --- |
| 1 | +VPRG | +3 to +6 volt programmable power |
| 2 | −VPRG | −3 to −6 volt programmable power |
| 3 | Offset | 0 to ±1 mamp offset current |
| 4 | Data | serial data/control/status/interrupt |
| 5 & ring | PID | probe identification resistor |
| 6 | Clk | serial clock/control/status/interrupt |
| 7 | $R_{prog}$ | (3 to 6) volt programming resistor |
| 8 | −12 V | −12 volt power |
| 9 | +12 V | +12 volt power |

The nine interface connections 100 shown in FIGS. 1 and 2 provide a power and a communication link between a probe 170, whether active or passive, and the test and measurement equipment 150 as well as providing the conventional BNC RF connection 120, 120'. In essence, each connection 100 represents a separate circuit and, therefore, a nine-circuit interface is provided between each probe pod 160 and the equipment 150 in a straight line 110 below the female BNC 120. The traditional probe identification ring 130 is used which surrounds the female BNC 120 to support existing BNC probes using the older probe ID schemes. The ring 130 also connects 140 to the middle pad 5, below the female BNC 120. In the preferred embodiment, the probe pod 160 contains nine pogo-pins 1'–9' to make contact with pads 1–9 on the equipment 150. Communication and power for the probe pod 160 (and therefore the probe 170) is derived from the equipment 150.

It is to be expressly understood that the test and measurement equipment 150 can be an oscilloscope, spectrum analyzer or any equivalent type of intelligent test and measurement instrument. It is also to be expressly understood that the probe pod 160 can be any of a number of different forms, shapes and designs which aligns and holds the pogo pins 1'–9' compressed against pads 1–9.

In the preferred embodiment, the equipment 150 has four interfaces 100 for connection to four separate probes 170. It is to be expressly understood that any number of interfaces 100 with the equipment 150 could be utilized. When multiple interfaces 100 are used, the various probes can share some of the circuitry in the equipment 150.

2. Probe Power

Figure 2A:
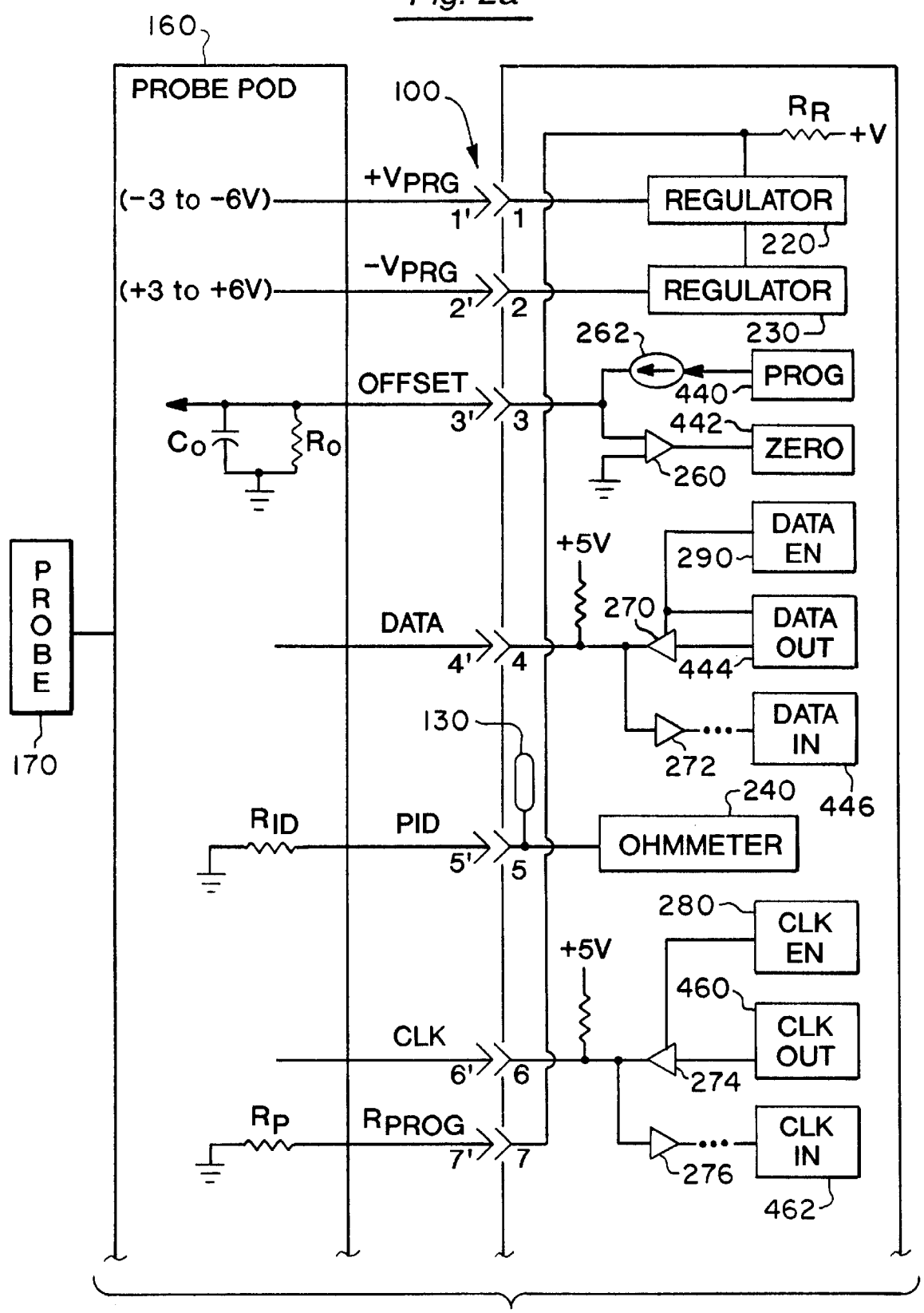
FIGS. 2a and 2b set forth the interface of the present invention illustrating the components in the probe pod and in the test and measurement equipment.
Figure 2B:
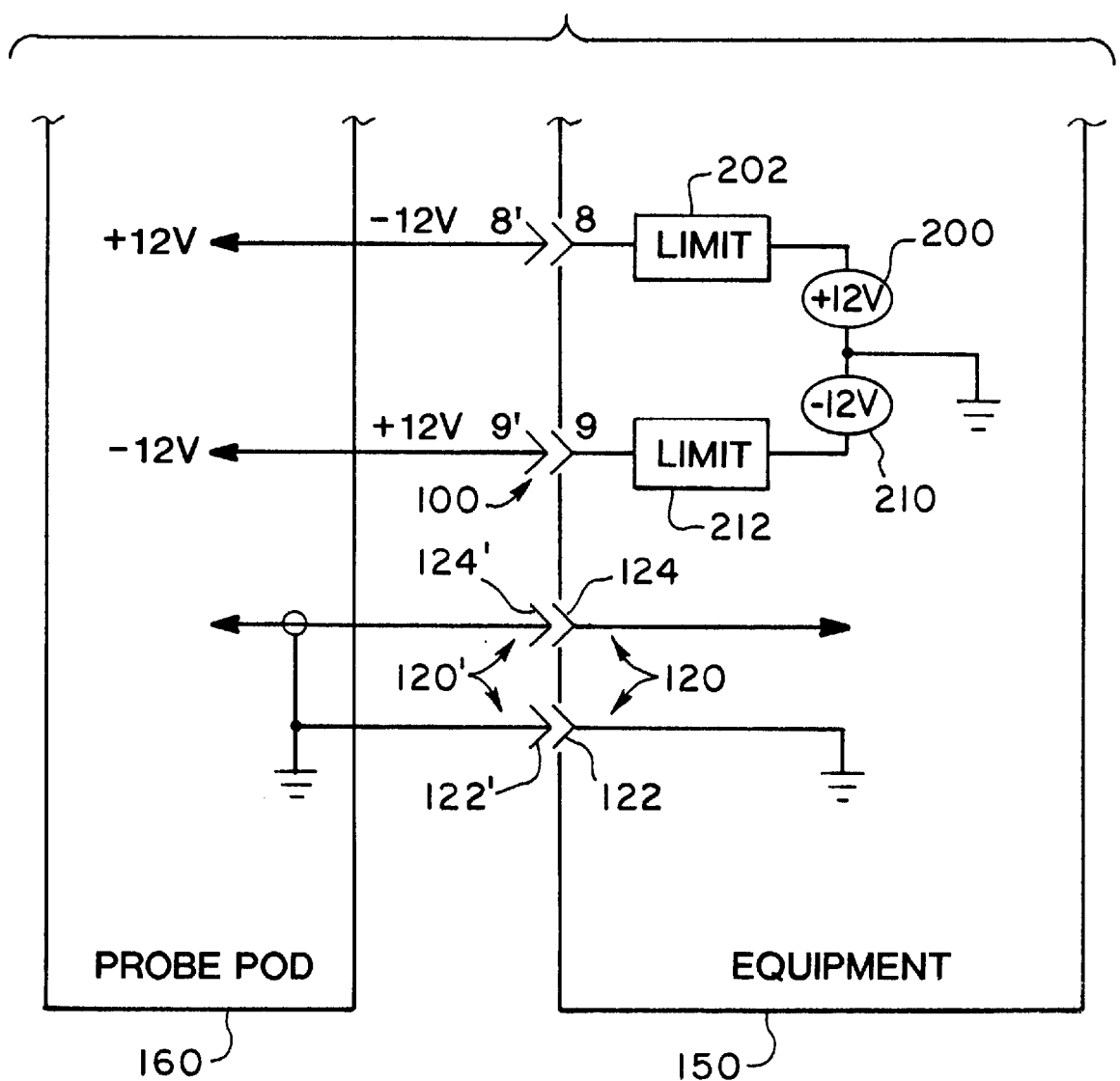

As shown in FIGS. 2a and 2b, power delivered to the probe consists of four voltages: +/−12 volts on connections 8 and 9 and a pair of complementary programmable voltages in the range of 3 to 6 volts on connections 1 and 2.

The +/−12-volt buses are supplied on connections 8'–8 and 9'–9 from power supplies 200 and 210 in the test and measurement equipment 150 and are current limited 202 and 212. In the preferred embodiment, the power supply outputs +/−12 volts within +1.2 volts and −0.6 volts.

As shown in FIG. 2a, there are two tracking series regulators 220 and 230 in the test and measurement equipment that provide current limiting. The regulators 220 and 230 provide +(3 to 6 volts) (+$V_{PRG}$) on connection 1'–1 and −(3 to 6 volts) (−$V_{PRG}$) on connection 2'–2. The actual voltage delivered over connections 1'–1 and 2'–2 is hardware programmable via a resistor, $R_p$, in the probe pod 160 which is delivered as signal $R_{prog}$ over connection 7'–7 to the two regulators 220 and 230. The value of the resistor $R_p$ in conjunction with resistor $R_R$ and voltage V hardware programs the voltage delivered over connections 1'–1 and 2'–2.

These programmable voltages are determined by one program resistor, $R_{prog}$, and can be determined using the following equations:

for ±VPRG = 3 + 60/(20 + $R_{prog}$) in volts [where $R_{prog}$ is in kohms]
or
$R_{prog}$ = 60/(VPRG−3) − 20 in kohms   [where VPRG is in volts and always positive and when VPRG = 3, $R_{prog}$ = infinity]

The following are four examples:
1) for +/−VPRG=3 volts, $R_{prog}$=infinity (i.e. an open)
2) for +/−VPRG=4 volts, $R_{prog}$=40 kohms
3) for +/−VPRG=5 volts, $R_{prog}$=10 kohms
4) for +/−VPRG=6 volts, $R_{prog}$=0 kohms (i.e. a short)

The tolerance for +/−VPRG=/<2% when using a 1% program resistor, $R_{prog}$.

Each probe pod 160 is allotted 0.2 amps of positive and 0.2 amps of negative supply current. The supply current can come, in any combination, from the 12 volt supplies 200 and 210 and/or from the programmable regulators 220 and 230. For example, 0.025 amps from the plus 12 volt supply 200 and 0.175 amps from the plus 6 volts regulator 220 for a total of 0.2 amps, and similarly from the negative supplies.

Supplying of the programmable voltage in the range of 3 to 6 volts from the two tracking series regulators 220 and 230 in the equipment 150 is an important feature of the present invention. In conventional probe pods 160, if the probe needs other voltages than are present at the interface, they are conventionally located in the probe pod 160. This adds weight to the probe pod 160, it occupies a large amount of space in the probe pod 160, and it adds heat to the probe pod 160. Hence, the placement of the regulators 220 and 230 in the equipment 150 and the placement of the programmable resistor $R_p$ in the probe pod 160 for delivery over pin 7 to precisely control the value of voltages delivered over pins 1 and 2 from the equipment to the probe pod 160 is an important feature of the present invention.

It is to be expressly understood that the design of the regulators 220 and 230 can be of any conventional design and that other equivalent voltage sources could be used.

3. Probe Identification

Connected to interface connection 5'–5 and to the ring 130 is an identification resistor $R_{id}$ in the probe pod 160. This is connected to an ohmmeter 240 in the equipment 150. The probe resistor $R_{id}$, whether located in active or passive probes identifies certain characteristics of the probe. When the probe pod 160 is connected to the equipment 150, the ohmmeter 240 determines the value of the resistor $R_{id}$. Based upon that value, characteristics of the probe 170 are automatically determined by the equipment 150 by means of a look-up table stored in memory 410. The equipment 150 then automatically and completely, without operator intervention, configures for the probe. Any suitable type of ohmmeter 240 could be used under the teachings of the present invention.

In Table II, which is an example of a look-up table, the various values for the resistor $R_{id}$ for individual active and passive probes as well as the operational characteristics of such probes are set forth.

TABLE II

| Probe | Probe Attenuation factor | | | | Input Z 1 meg | | Probe Options | | $R_{ID}$ Value | |
|---|---|---|---|---|---|---|---|---|---|---|
| # | 1:1 | 10:1 | 100:1 | other | ohms | 50 | offset | other | Ohms | comments |
| 1 | * | | | | * | | | | 1k | probe |
| 2 | * | | | | | * | | | 3.16k | look-up |
| 3 | * | | | | | * | * | | 3.48k | table |
| 4 | * | | | | | * | * | AC | 3.83k | |
| 5 | | * | | | * | | | | 9.09k | |
| 6 | | * | | | | * | | | 14.7k | |
| 7 | | * | | | | * | * | | 16.2k | |
| 8 | | * | | | | * | * | AC | 17.8k | |
| 9 | | | * | | * | | | | 19.6k | |
| 10 | | | * | | | * | | | 21.5k | |
| 11 | | | * | | | * | * | | 23.7k | |
| 12 | | | * | | | * | * | AC | 26.1k | |
| 13 | | | | 5:1 | | * | | | 28.7k | |
| 14 | | | | 20:1 | | * | | | 31.6k | |
| 15 | | | | 50:1 | | * | | | 34.8k | |
| 16 | | | | 200:1 | | * | | | 38.3k | |
| 17 | | | | 1.000:1 | * | | | | 42.2k | |
| 18 | * | | | | | | | | 0 | existing |
| 19 | * | | | | | | | | 11k | probes |
| 20 | * | | | | | | | | 2.2k | |
| 21 | | * | | | | | | | 5.1k–6.8k | |
| 22 | | | | 20:1 | | | | | 1.5k | |
| 23 | | | | DIGITAL ID | | | | | 46.4k | digital ID |
| 24 | | | | | | | | | 51.1k | reserved |
| 25 | | | | | | | | | 56.2k | for future |
| 26 | | | | | | | | | 61.9k | probes |
| 27 | | | | | | | | | 68.1k | |
| 28 | | | | | | | | | 75k | |
| 29 | | | | | | | | | 82.5k | |

TABLE II-continued

| Probe # | Probe Attenuation factor | | | | Input Z 1 meg ohms | | Probe Options | | $R_{ID}$ Value Ohms | comments |
|---|---|---|---|---|---|---|---|---|---|---|
| | 1:1 | 10:1 | 100:1 | other | | 50 | offset | other | | |
| 30 | | | | | | | | | 90.9k | |
| 31 | | | | | | | | | 100k | |
| 32 | | | | | | | | | 110k | |
| 33 | | | | | | | | | 121k | |
| 34 | | | | | | | | | 133k | |
| 35 | | | | | | | | | 147k | |
| 36 | | | | | | | | | 178k | |
| 37 | | | | | | | | | 215k | |
| 38 | | | | | | | | | 261k | |
| 39 | | | | | | | | | 316k | |
| 40 | | | | | | | | | 464k | |

In Table II, "AC" means AC coupling where the coupling corner is equal to or less than 10 Hertz.

In Table II, the first column identifies forty separate probes with different identification resistors $R_{ID}$. Under the teachings of the present invention, any number could be utilized. Probes numbered 1–17 were chosen to correspond to probes having common characteristics. For example, probe 12 has a 100:1 probe attenuation factor, a 50 ohms input impedance (i.e., input Z), offset control, and AC coupling. Probe 12 has its $R_{ID}$ set to 26.1 Kohms. In a second example, probe 17 has 1000:1 probe attenuation and an input impedance of 1 Megohm. Probe 17 has its $R_{ID}$ set to 42.2 Kohms. Probes numbered 18–22 are existing probes known by the assignee of the present invention and adapted to the interface of the present invention. Probe 23 is reserved for a digital interface such as I²C. For probes numbered 24–40, the resistance values change by 10% which requires a measurement accuracy of +/–5%. Probes 24–40 are reserved for future use. Such probes could include current probes, fiber optic probes with different offset voltage ranges, etc.

As will be more fully explained later, the contents of Table II are conventionally stored in memory 410 of FIG. 4 as a look up table. When a probe 170 is connected to the equipment 150 at interface 100, the equipment determines the value of $R_{ID}$ and obtains the characteristics (i.e., columns 2, 3, and 4 of Table II) for that probe from memory 410. The equipment 150 then automatically and completely configures the equipment for the probe 170 without operator intervention.

The contents of memory 410 (i.e., corresponding to Table II) can be modified from time-to-time. For example, assume a future probe has a 1:1 attenuation factor, 50 ohms input impedance, offset current, and DC reject (DCR). Along with the future probe could come software or written instructions wherein the memory 410 could be updated to include the characteristics for the new probe. Table II illustrates these characteristics entered into memory 410 for this new probe, which are number 24. It can be readily appreciated that the universal probe interface 100 of the present invention is capable of significant flexibility for future probe designs while accommodating most of the standard probe designs (probes 1–17), and existing probe design (probes 18–22). Furthermore, digital ID probes can also be accommodated.

It is to be understood that some probes 170 will use all nine of the interface connections 100 and that other probes 170 will use various connections in the interface. However, the interface is universal. In addition, probes having only a BNC connector with a pogo pin contacting the ring 130 will easily connect into the universal interface 100 and will have its $R_{ID}$ read through pad 5 of the interface 100 since pad 5 is connected to ring 130.

When the equipment 150 is turned on, it reads the probe's ID to know how to setup the equipment, as it is possible a different probe 170 was installed when the power was off.

Figure 3:
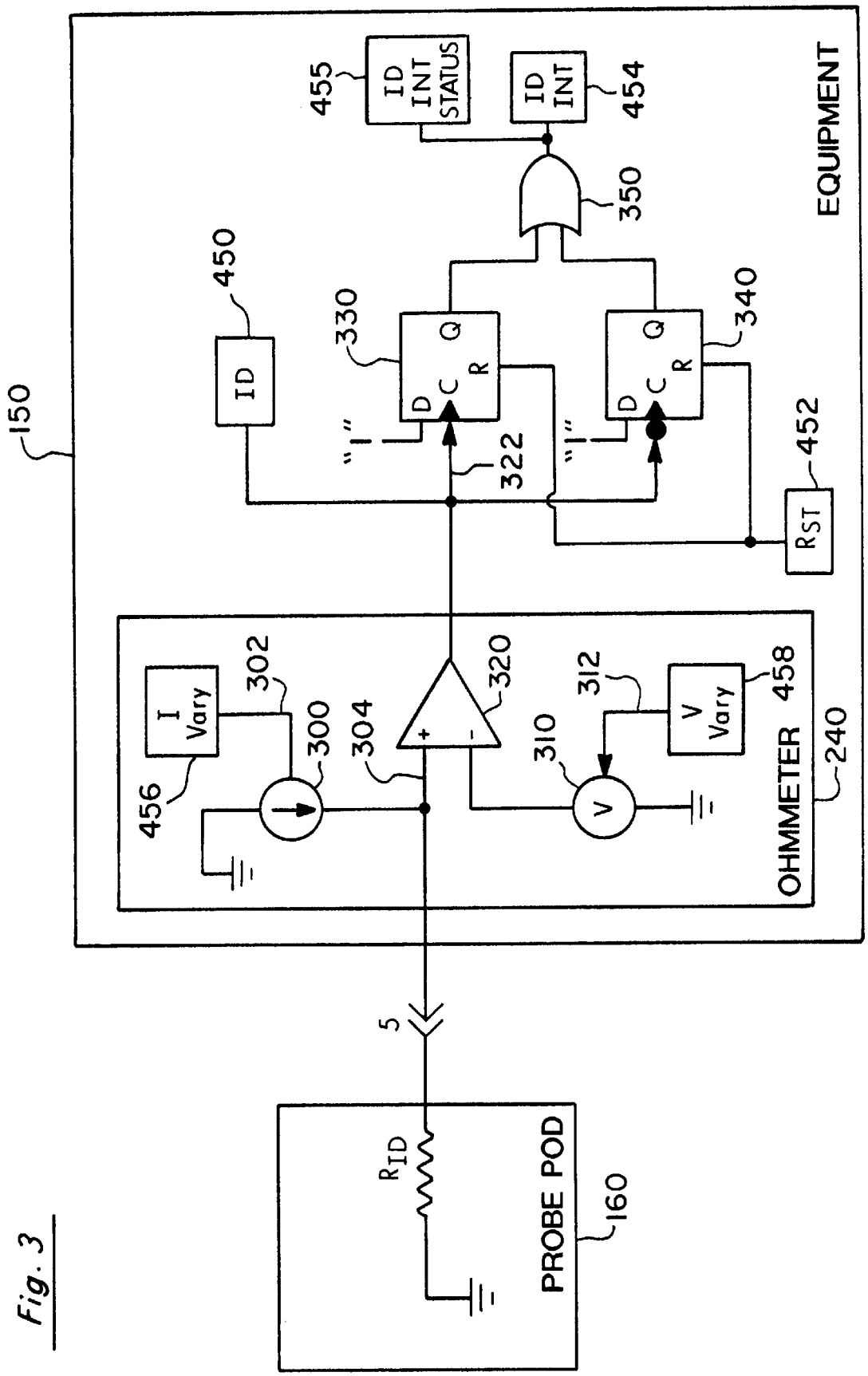
FIG. 3 sets forth the details of the ohmmeter of the present invention.

In FIG. 3, the details of the ohmmeter 240 are shown to include a 2 to 100 microamp current source 300, which is used to excite the probe resistor $R_{id}$. A voltage source 310 is used as a reference voltage. A comparator 320 compares the $R_{id}$ voltage to the reference voltage 310. The current source 300 is varied on line 302 under control of a digital-to-analog converter (DAC) 456 and the voltage 310 is varied over line 312. In the preferred embodiment, 16 channel, 16 bit DACs 456, 458 are used to control the current source 300 and the voltage source 310. An example of such a DAC is found in U.S. Pat. No. 5,041,831.

In the preferred embodiment, the probe resistor $R_{id}$ is measured at least twice using two separate values of current. The first measurement value is at 100 microamps and the second measurement value is at 25 microamps. By using two separate measurement values, measurement errors caused by comparator offset voltage, transistor $V_{BE}$ differences, resister tolerances and probe ground offset voltage errors are minimized. The voltage source 310 is varied between 0 and 5 volts by the DAC 458.

In FIG. 3, the output of comparator 320 is delivered into flip-flops 330 and 340. As mentioned, the current 300 is first set at 100 microamps and then the voltage 310 is varied under control of line 312 until the voltage from 310 matches the voltage across resistor $R_{id}$. This voltage will be less than 5 volts. The output of the comparator 320 will change state when crossing the matching voltage.

An example of the two current readings for a resistor $R_{id}$ follows. Assume current generator 300 first delivers 100 microamps to resistor $R_{id}$. In this example, $R_{id}$ is 42.2 kohms for probe 17 in Table II. This develops a voltage of 4.220+Δ volts across resistor $R_{id}$ where Δ=±voltage due to measurement errors. The value of voltage is determined by varying voltage source 310 until the reference voltage from voltage source 310 corresponds (as explained below) to 4.220+Δ. During the second current delivery of 25 microamps, a voltage of 1.055+Δ volts is determined by the voltage source 310. The first voltage read is 4.220+Δ volts and the second voltage read is 1.055+Δ volts. The difference in voltage between these two readings is 3.165 volts. The Δ readings are eliminated through subtraction. The difference in current between the two readings is 75 microamps (100 microamps minus 25 microamps). Hence, the resistance, as measured by the two readings, is 3.165 volts divided by 75 microamps or 42.2 kohms.

It is possible that the first measurement at 100 microamps from current source 300 drives the comparator into saturation. The voltage 310 is set at 5 volts and if the voltage on line 304 is greater than 5 volts, a saturation condition exists. In this event, the current source 300 under control of the I VARY DAC 456, reduces the current and the determination of saturation occurs again. This process repeats until a voltage less than 5 volts appear on lead 304. Hence, the current used in the first reading may be less than 100 microamps and the current used in the second reading will also be adjusted lower. For example, if the comparator 320 moves out of saturation when the first current is 90 microamps, the second current is lower, such as 20 microamps.

The varying of the voltage by DAC 458, in the preferred embodiment, is a binary search. Since the voltage source is initially set at 5 volts, the first control from DAC 458 is 2.50 volts, if the voltage on 304 is higher (which in the above example of 4.220+Δ volts, it is), then the output of comparator 320 is high which is sensed and which causes the Voltage Vary DAC 458 to control the source 310 to deliver 2.50+1.25 or 3.75 volts to comparator 320. Again in the above example, the voltage 4.22+Δ volts on lead 304 is higher than 3.75 volts. The DAC 458 then causes source 310 to deliver 3.750+0.625 or 4.375 volts. This voltage is higher than the voltage on lead 304 and the comparator's 320 output goes low. The DAC 458 delivers 4.375−0.313 or 4.062 volts. This voltage is less than 4.220 and the comparator goes high. The DAC 458 delivers 4.062+0.157 or 4.219 volts. This binary process continues until the desired accuracy is achieved.

After the determination of $R_{id}$ is made, the current source 300 is set at a quiescent condition of 5 microamps by lead 302 and the voltage source 310 is set at a quiescent condition of 5 volts. The ohmmeter 240 is now conditioned to sense when the probe pod 160 is unplugged from the equipment 150. When the probe pod 160 is disconnected from the equipment 150, an open circuit is detected (greater than 1 megohm) which will generate an interrupt signal ID INT 454. The open circuit at connection 5'–5 causes the voltage on lead 304 to suddenly go higher than 5 volts which causes the signal on lead 322 to be high which sets flip-flop 330 to have its Q output high.

It is to be expressly understood that as long as the probe pod 160 is plugged in at connection 5, a voltage less than 5 volts is delivered on line 304 to the comparator 320. However, when the probe pod 160 is unplugged, a "1" signal is delivered on line 322 to flip-flop 330 and flip-flop 340. This provides a "1" signal through the OR-gate 350 which is delivered as interrupt signal ID INT 454. Hence, the equipment 150 immediately knows when a probe 170 is disconnected from oscilloscope. This is an important feature of the present invention since an interrupt signal 454 is generated as soon as the probe is disconnected. A data signal ID INT STATUS is delivered onto line 455 to verify the existence of the interrupt signal. Upon verification, a reset $R_{ST}$ 452 signal is delivered to the flip-flops 330 and 340.

When an ID interrupt signal is generated 454, the equipment 150 is programmed to generate a momentary on-screen message that alerts the user as to what has happened, i.e., a probe connected or a probe disconnected. If a probe is connected, automatic configuration occurs. If a probe is disconnected, the no probe configuration state is entered.

When a probe pod 160 is reattached to the equipment 150, the resistance at connection 5 will drop below 1 megohm and the output of the comparator 320 goes low to indicate less than 5 volts which generates an interrupt. The ohmmeter 240 then determines the probe ID resistance $R_{id}$.

In the preferred embodiment the current source 300 in the ohmmeter 240 is designed to have a range from 2 to 100 microamps, and absolute accuracy of +/−1.5 microamps and an accuracy of delta current (i.e. for the two current settings discussed above) of +/−0.5 microamps.

4. Data and Clock Pins

The present invention provides a clock line connection 6'–6 and a data line connection 4'–4 for two-way communication between the probe 170 and the equipment 150. This interface provides $1^2C$ compatible digital communication but can also provide various, other protocols. Under the teachings of the present invention and in alternative embodiments, both lines can be used as control lines and status lines. In the preferred embodiment, the clock line CLK is used for interrupts. A driver 270 can deliver data (or other) signals from the equipment to the probe pod 160 and a buffer 272 can receive data (or other signals) from the probe pod 160. Likewise, a driver 274 can deliver clock (or other) signals from the equipment to the probe pod 160 and a buffer 276 can deliver clock (or other) signals from the probe pod 160.

In some probes 170, the user of the probe can push a conventional button on the probe tip to initiate an interrupt, which can be delivered over connection 6'–6 through buffer 276. This is conventionally referred to as "auto acquire." This conventionally causes the equipment 150 such as an oscilloscope to "freeze frame" if it is in the run mode. If the oscilloscope is in a single shot mode, the oscilloscope will perform a conventional "trigger arm."

5. Offset Capability

Connection 3'–3 of the interface 100, as shown in FIGS. 1 and 2 delivers OFFSET current from the equipment 150 to the probe pod 160. As shown in FIG. 2, a resistor $R_o$ and a capacitor $C_o$ is provided in the probe pod 160. Resistor $R_o$ in the probe pod 160 makes the current-to-voltage conversion and references the offset voltage to the probe common. Capacitor $C_o$ in parallel with the resistor $R_o$ provides filtering and electrostatic discharge protection. $R_o$ is, in the preferred embodiment, approximately 5 kohms so as to yield a compliance voltage of +/−5 volts. This compliance voltage insures proper operation of the offset current filtering. In the preferred embodiment the OFFSET current is +/−1 milliamp with a tolerance of +/−0.01 milliamps. The OFFSET voltage limit developed over $R_o$ is +/−6 volts max. In the equipment 150, a current source $I_o$ which is controlled by PROG 440 which delivers the OFFSET current through connection 3'–3 to the probe pod 160 and to resistor $R_o$. PROG 440 is a conventional DAC and is set to deliver the required offset current to the probe.

OFFSET comparator 260 is used to calibrate for zero output during calibration. When the probe pod 160 is disconnected from the equipment 150, the current source $I_o$ 262 is programmed to deliver zero milliamps +/−0.1 microamps. This could be verified by sensing the output of comparator 260 and doing a binary search (as discussed above) with the offset PROG DAC 440 controlling to determine what DAC code gives a zero current. If not, the PROG 440 output to the current source $I_o$ 262 could be suitably modified to produce a zero current at the output of comparator 260. In the preferred embodiment, the PROG 440 control of the current source $I_o$ 262 has a resolution of 0.015 microamp steps.

6. Test and Measurement Equipment

Figure 4:
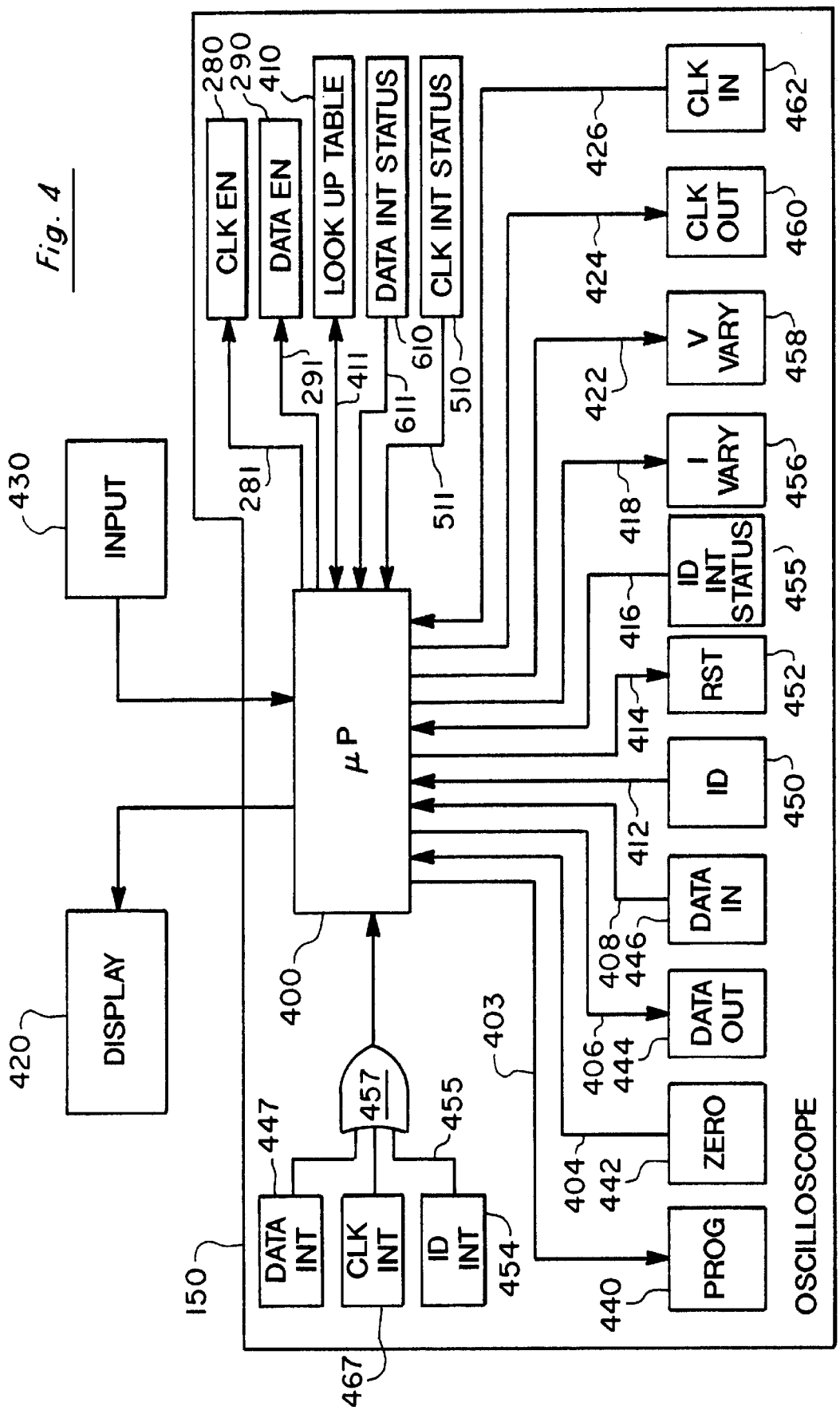
FIG. 4 sets forth the block diagram components of the test and measurement equipment.

The general configuration of the equipment 150 of the present invention is shown in FIG. 4. The equipment 150 has a conventional microprocessor 400, which accesses a memory lookup table 410. The microprocessor conventionally is interconnected to a display 420 and to an input device 430. Any of a number of input devices 430 could be used such as the keyboard, touch screen, disk, etc. The microprocessor 400 controls the various circuit of the interface as discussed above. The microprocessor 400 is connected to a look up table 410 over lines 411. The contents of the look up table 410 contain the probe operational characteristics found in Table II.

With reference to FIGS. 3 and 4, when a probe 170 is connected to the equipment 150, an ID interrupt 454 is delivered over line 455 through OR-gate 457 to the microprocessor 400. The computer verifies which interrupt has been received by checking ID interrupt status 455 over line 416. The microprocessor 400 resets the flip-flops 330 and 340 by sending a signal over line 414 to RST 452.

The equipment 150 now determines the resistance of Resistor $R_{id}$. In the procedure discussed above, two measurements of the resistance $R_{id}$, are taken by the microprocessor 400 varying the I Vary DAC 456 and the V Vary DAC 458 over lines 418 and 422 respectively. After each measurement step, the microprocessor 400 over line 412 reads ID 450 to determine the output of gate 350 in the ID interrupt 454. The microprocessor 400 knows the voltage DAC value it delivered over line 422 to the V Vary DAC 458 circuit after the completion of the divide-by-two process which DAC value corresponds to the voltage across the probe $R_{id}$. Hence, the microprocessor 400 determines the identity of the probe that was attached and looks up the identified probe's operational characteristics in Table 410.

The microprocessor 400 then automatically configures the equipment 150 for the attached probe and sets up the equipment 150 for the probe characteristics. For example, the microprocessor 400 may deliver the proper data values over lines 403 to the PROG DAC 440 for controlling the offset current 262 as shown in FIG. 2a.

Figure 5:
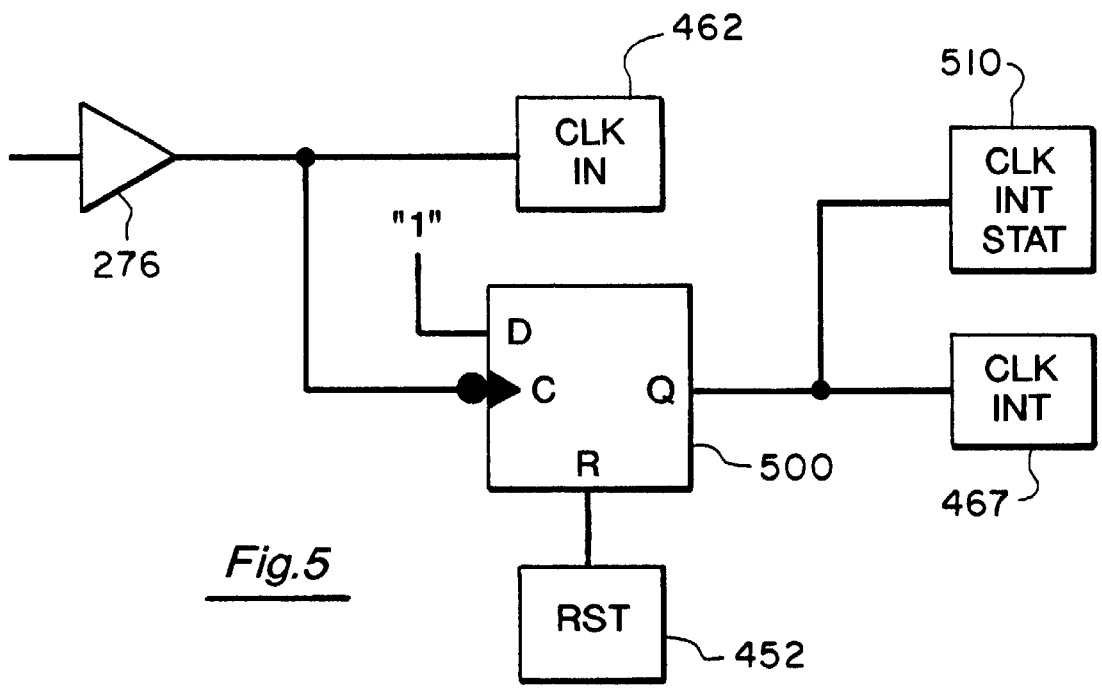
FIG. 5 sets forth the circuit details for the clock interrupt.

In FIGS. 2 and 4, the microprocessor 400 controls the clock enable 280 over lines 281 and delivers the clock signal over lines 424 to the clock out 460. In this fashion clock signals can be delivered over connection 6'–6 into the probe pod 160. Clock interrupt signals can be delivered back to the microprocessor 400 over line 426 from clock in 462. This is shown in FIG. 5 where the output of amplifier 276 is delivered into a flip-flop 500, which can be reset by the microprocessor over RST 452. In operation, when a clock interrupt is delivered from the probe pod 160 over connection 6'–6, it enters amplifier 276 and sets flip-flop 500 to issue a clock interrupt signal 462 which is delivered into gate 457 for delivery to the microprocessor 400. The microprocessor 400 verifies a clock interrupt status 510 over line 511. After the interrupt has been verified, the microprocessor can reset 452 flip-flop 500 in a conventional fashion. The microprocessor 400 can also receive clock signals from the probe pod 160 at Clock In 462.

Figure 6:
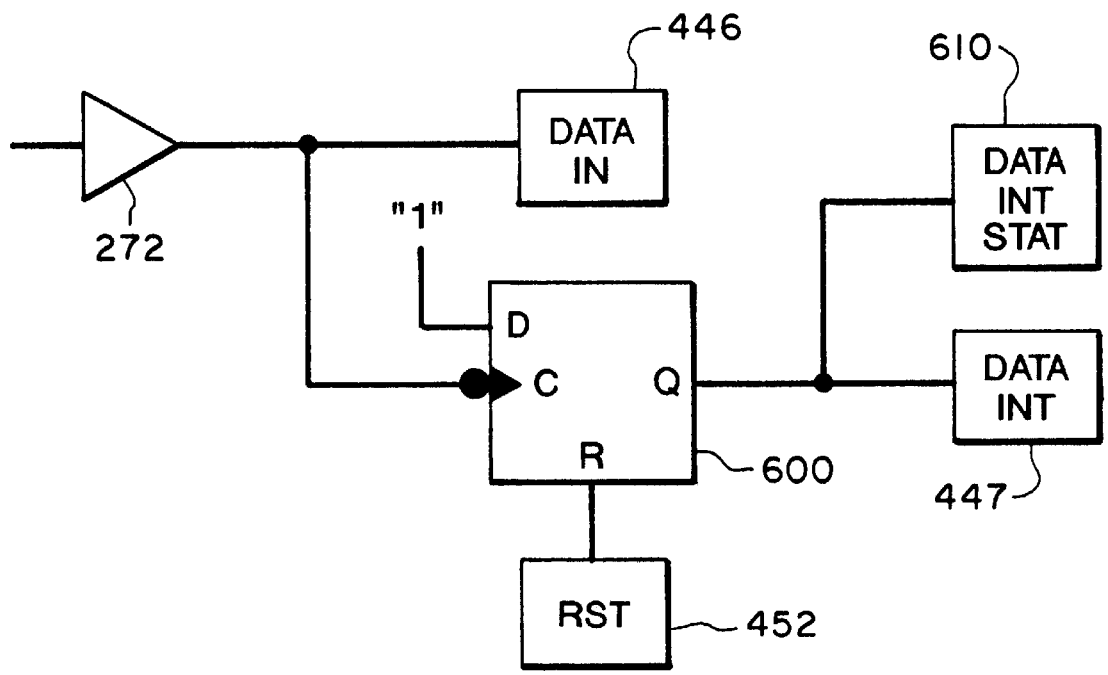
FIG. 6 sets forth the circuit details for the data interrupt.

The operation of the data circuit is similar to that of the clock circuit described above. With reference to FIGS. 2a, 4, and 6, the enabling of data signals occurs at 290 and the delivery of data signals through Data Out 444. Hence, the microprocessor 400 delivers data signals over lines 406 through Data Out 444 through amplifier 270 and through connection 4'–4 to the probe pod 160. Likewise, data can be returned from the probe pod 160 to the microprocessor 400. In FIG. 6, incoming data is delivered through amplifier 272 and directly to Data In 446 for delivery over lines 408 to microprocessor 400. An interrupt can also come over connection 4'–4 and the interrupt sets flip-flop 600 to issue a data interrupt Data INT 446. The microprocessor 400 verifies the status of the data interrupt at 610 over line 611. The flip-flop 600 can be reset RST 452 by the microprocessor.

It is to be expressly understood that the block diagram of FIG. 4 is functional in presentation and that a number of conventionally available systems could be used to implement it.

While the present invention has been particularly shown and described with reference to the preferred embodiment, it will be readily apparent to those of ordinary skill in the art that various changes and modifications may be made without departing from the scope of the invention as set forth below in the appended claims. Hence, the terms, titles, and features found in the aforesaid specification and attached claims are terms of description and not of limitation and that these terms and descriptions include equivalents of the various features shown in the drawing, discussed herein and claimed in the following.

We claim:

1. An interface between a probe and test and measurement equipment, said probe having a pod, said interface having a plurality of connections between said pod and said test and measurement equipment, said interface comprising:

a fixed voltage source in said test and measurement equipment, a fixed voltage delivered from said fixed voltage source through two of said plurality of connections to said pod, a voltage programming resistor in said pod producing a signal, said signal delivered from said pod through one of said plurality of connections to said test and measurement equipment, a programmed voltage delivered from said test and measurement equipment through two of said plurality of connections to said pod, the value of said programmed voltage controlled by said delivered signal from said voltage programmed resistor, a probe identification resistor in said pod, an ohmmeter in said test and measurement equipment, said ohmmeter measuring the value of said probe identification resistor in said pod through one of said plurality of connections, a two-way communication path between said pod and said test and measurement equipment through two of said plurality of connections, an offset current generator in said test and measurement equipment, said offset current generator providing offset current to said pod through one of said plurality of connections.

2. The interface of claim 1 wherein said fixed voltage is delivered as a positive fixed voltage through a first connection and as a negative fixed voltage through a second connection.

3. The interface of claim 2 wherein said fixed voltage is twelve volts.

4. The interface of claim 1 wherein said programmed voltage is delivered as a positive programmed voltage through a first connection and as a negative programmed voltage through a second connection.

5. The interface of claim 4 wherein said programmed voltage is in the range of three to six volts.

6. The interface of claim 1 wherein said ohmmeter issues an interrupt signal when said pod is connected or disconnected from said test and measurement equipment.

7. The interface of claim 1 wherein said two-way communication path includes a clock signal on one of said two connections.

8. The interface of claim 1 wherein said two-way communication path includes a data path on one of said two connections.

9. The interface of claim 1 wherein the zero current of said offset current generator calibrated independent of the probe.

10. The interface of claim 1 further comprising a BNC connector with said plurality of connections in a line beneath said BNC connector.

11. An interface between a probe and test and measurement equipment, said interface having a plurality of connections between said probe and said test and measurement equipment, said interface comprising:

a first connection, a second connection coupled to said probe, a voltage programming resistor located in said probe and coupled to said first connection, and a voltage regulator located in said test and measurement equipment and coupled to said first and second connections, said voltage regulator receiving an input signal from said first connection and transmitting a voltage signal across said second connection, said voltage signal having a value based on a resistance value of said voltage programming resistor.

12. The interface of claim 11 wherein said value of said voltage is in the range of three to six volts.

13. An interface between a probe and test and measurement equipment, said interface having a plurality of connections and a BNC connection having male and female portions between said probe and said test and measurement equipment, said interface comprising:

said plurality of connections formed in a line under said BNC connection;

a probe identification ring around the female BNC portion mounted on the equipment;

one of said plurality of connections in electrical contact with said ring;

a probe identification resistor in said probe;

an ohmmeter in said test and measurement equipment, said ohmmeter measuring the value of said probe identification resistor in said probe through said one connection.

14. An interface between a probe and test and measurement equipment, said probe, said interface having a plurality of connections between said probe and said test and measurement equipment, said interface comprising:

an offset current generator in said test and measurement equipment, said offset current generator providing offset current to said probe through one of said plurality connections, said equipment calibrating said offset current generator for zero current independent of said probe.

15. A universal interface between a plurality of probes and test and measurement equipment, said universal interface having a fixed number of connections between said plurality of probes and said universal test and measurement equipment, said interface comprising:

probe identification resistors respectively located in said plurality of probes, each of said probes having a different resistance value and one of said probes connected to said test and measurement equipment, an ohmmeter in said test and measurement equipment, said ohmmeter measuring a value of one of said probe identification resistors in said one probe through one of said fixed number of connections when said one probe is connected to said test and measurement equipment, a memory in said equipment containing the operational characteristics for said plurality of probes, a processor in said equipment for controlling said ohmmeter to determine the value of said one probe identification resistor, said processor obtaining from said memory the operational characteristics of said one probe based on said value measured for said one probe identification resistor, said processor automatically configuring said equipment to provide said operational characteristics for said one probe through said interface.

16. The universal interface of claim 15 wherein said ohmmeter issues an interrupt signal when a probe is connected to said test and measurement equipment.

17. The universal interface of claim 15 wherein said ohmmeter issues an interrupt signal when a probe is disconnected from said test and measurement equipment.

* * * * *